United States Patent [19]

Juve et al.

[11] 4,197,493
[45] Apr. 8, 1980

[54] ELECTROSTATIC VOLTMETER

[75] Inventors: Ronald A. Juve; Robert R. Hay, both of Boise, Id.

[73] Assignee: Hewlett-Packard Company, Palo Alto, Calif.

[21] Appl. No.: 905,066

[22] Filed: May 11, 1978

[51] Int. Cl.$^2$ ............................................ G01R 31/02
[52] U.S. Cl. ........................................ 324/72; 324/457
[58] Field of Search ............... 324/72, 72.5, 32, 33, 324/109

[56] References Cited

U.S. PATENT DOCUMENTS

| | | | |
|---|---|---|---|
| 2,605,428 | 7/1952 | Kalmus et al. | 324/33 |
| 2,624,847 | 6/1953 | Jesse et al. | 324/33 |
| 4,106,869 | 8/1978 | Buchheit | 324/72 |

Primary Examiner—Michael J. Tokar
Attorney, Agent, or Firm—Michael L. Sherrard

[57] ABSTRACT

An electrostatic voltmeter for measuring the electrostatic potential on a photosensitive drum has a detector capacitively coupled to the drum for providing an output signal in response to the potential on the drum. An AC voltage source is coupled in circuit with the drum and the detector for applying an AC signal across the surface-to-detector capacitance. Circuitry coupled to the detector determines the detector gain in response to the value of the AC component of the output signal and the value of the applied AC signal. The product of the reciprocal of the detector gain and the value of the DC component of the output signal is representative of the electrostatic potential on the surface.

13 Claims, 5 Drawing Figures

ELECTROSTATIC VOLTMETER

BACKGROUND OF THE INVENTION

The present invention relates to non-contacting electrostatic voltmeters. Non-contacting electrostatic voltmeters measure an electrostatic potential on a surface without physical contact therewith. Typical non-contacting electrostatic voltmeters are described in U.S. Pat. No. 3,525,936, entitled "Electrostatic Voltage Follower Circuit for Use as a Voltmeter", issued to Robert E. Vosteen on Aug. 25, 1970, and in U.S. Pat. No. 3,611,127, entitled "Electrostatic Potential and Field Measurement Apparatus Having a Capacitor Detector with Feedback to Drive the Capacitor Detector to the Potential Being Measured", issued to Robert E. Vosteen on Oct. 5, 1971. These voltmeters have mechanical devices for varying the capacitance between a detector and the surface. This varying capacitance produces an alternating current error signal on the detector proportional to the difference between the DC voltage of the detector and the potential on the surface. A feedback circuit is coupled to the detector for causing the DC voltage of the detector to be adjusted to a value equal to the potential of the surface in response to the error signal. The potential on the surface is determined by measuring the DC voltage on the detector. However, the mechanical devices required to vary the detector-surface capacitance are undesirably complex. Further, in order to adjust the DC detector voltage, an undesirably expensive, adjustable high-voltage power supply is required.

Other typical non-contacting electrostatic voltmeters have detectors capacitively coupled to the surface and to ground. The potential of the surface can be determined from the DC voltage of the detector and the values of the detector-to-surface and the detector-to-ground capacitances. However, it is undesirably difficult to accurately determine the detector-to-surface capacitance. Without accurately determining this capacitance the potential of the surface cannot be precisely measured with this type of voltmeter.

SUMMARY OF THE INVENTION

In accordance with the illustrated preferred embodiments, an electrostatic voltmeter has a detector capacitively coupled to a photosensitive drum and to a source of reference potential for providing a detector voltage in response to the electrostatic potential of the drum. Further, an alternating current (AC) voltage source is coupled for applying a reference AC signal across the series combination of the surface-to-detector and detector-to-source capacitance. Specifically, this AC voltage source may be coupled between the source of reference potential and ground. Circuitry coupled to the detector determines the ratio of the magnitude of the reference AC signal to the magnitude of the AC component of the detector voltage. The electrostatic potential of the surface is thereafter determined by multiplying the value of the direct current (DC) component of the detector voltage by this ratio. In one of the illustrated preferred embodiments, a variable gain amplifier is coupled to the detector. The gain of this amplifier is adjusted to provide a predetermined ratio of the reference AC signal to the amplified AC voltage component of the detector output signal. The electrostatic potential of the surface is thus the product of the amplified DC voltage component of the detector output signal and the predetermined ratio.

DETAILED DESCRIPTION OF THE PREFERRED EMBODIMENT

Figure 1:
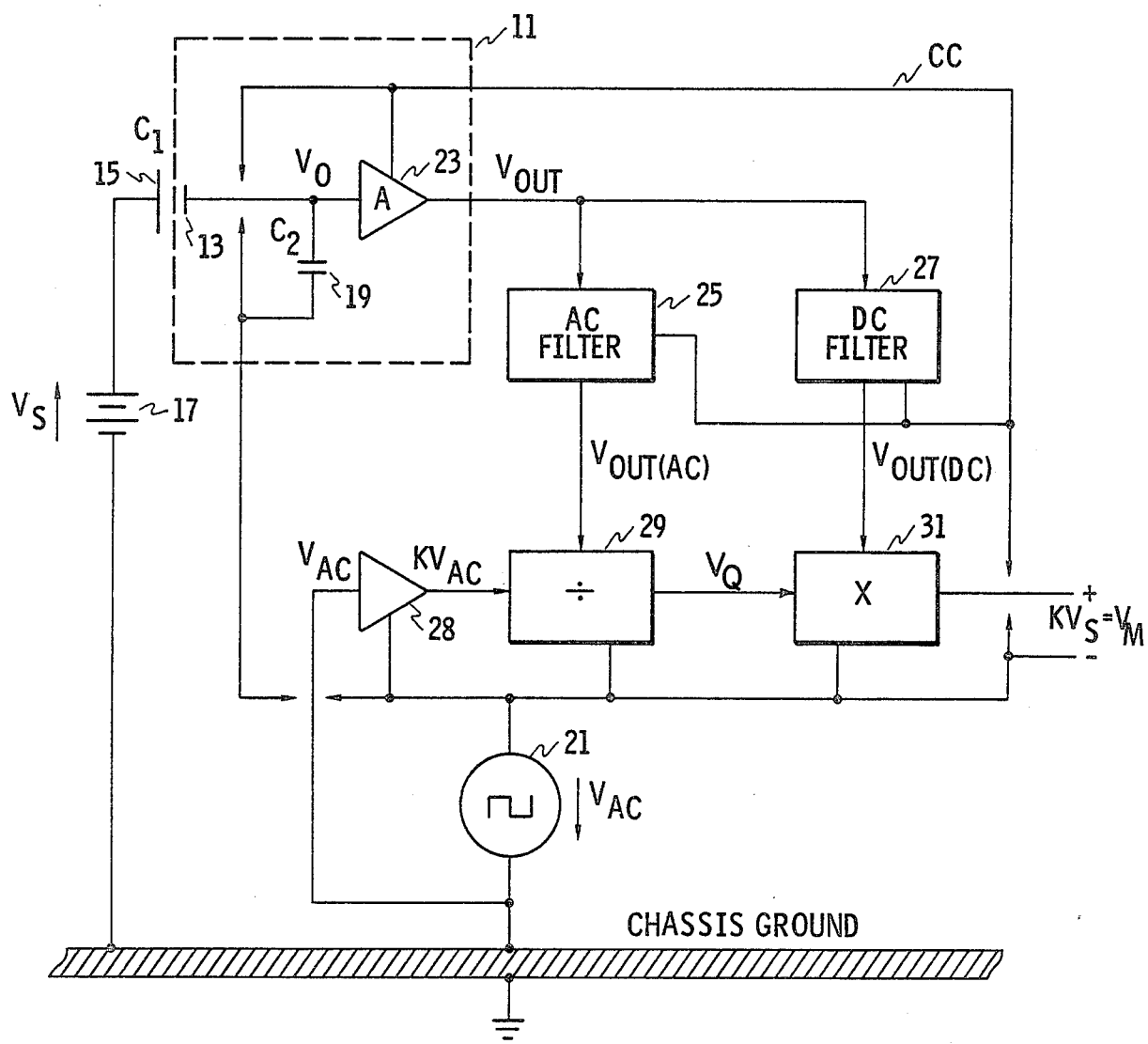
FIG. 1 is a block diagram of an electrostatic voltmeter according to preferred embodiment of the present invention.

As shown in FIG. 1, a detector 11 has an electrode 13 capacitively coupled to a member 15 for measuring the electrostatic potential $V_S$ of the member. Member 15 is AC-coupled to ground. For illustrative purposes, the electrostatic potential $V_S$ and the AC-coupling to ground are represented by a battery 17 coupled between member 15 and ground. Typical values for electrostatic potential $V_S$ are between −50 and 600 V. Specifically, in one preferred embodiment, member 15 is a rotating photosensitive drum of an electrophotographic printer comprising a mylar insulator deposited upon a cadmium sulfide photoconductor. The photoconductor is deposited upon an aluminum core which is coupled to ground. The capacitances across the insulator and the photoconductor are approximately 107 pf/sq. cm and 89 pf/sq. cm respectively. These capacitances can be treated as negligibly low impedances to the AC signal under the operating conditions of the present invention, thus providing the AC-coupling of member 15 to ground.

In the preferred embodiment, electrode 13 has a surface area of 0.30 sq. cm and is spaced 4 mm away from member 15. The capacitance $C_1$ between electrode 13 and member 15 is preferably 0.03 picofarads (pf).

In the preferred embodiment, a capacitor 19 having a capacitance $C_2$ of 180 pf is coupled between electrode 13 and a circuit common CC. However, the capacitance $C_2$ does not need to be provided by a discrete component as illustrated, but may be provided by residual capacitances between electrode 13 and the circuit common.

An AC voltage source 21 is preferably coupled between circuit common CC and ground for providing an AC signal having a voltage of magnitude $V_{AC}$ across the series combination of the capacitances $C_1$ and $C_2$. A 5 KHz, 20 volt peak-to-peak squarewave is used in the preferred embodiment.

An amplifier 23 is coupled to electrode 13 for receiving the voltage $V_o$ on the electrode. Amplifier 23 is referenced to circuit common CC, i.e., $V_{out} = V_o A$ where A is the amplification of amplifier 23 and $V_{out}$ and $V_o$ are both measured relative to circuit common CC. The illustrated coupling in FIG. 1 of amplifier 23 to the circuit common CC is symbolic of the coupling which references amplifier 23 to circuit common CC. This symbol for referencing amplifiers to circuit common is also used in subsequent figures.

An AC filter 25 is coupled to amplifier 23 and to circuit common CC. This filter passes the AC component, $V_{out}(AC)$, of output signal $V_{out}$. A DC filter 27, coupled to amplifier 23 and circuit common CC, passes the DC component, $V_{out}(DC)$, of output signal $V_{out}$. The AC component $V_{out}(AC)$, and a signal, $KV_{AC}$, provided by an amplifier 28 are applied to divider 29. The divider provides a quotient signal, $V_Q$, representative of the value of $KV_{AC}$ divided by $V_{out}(AC)$. A multiplier 31 is coupled to divider 29 and DC filter 27 for multiplying the quotient from divider 29 by the value of the detected DC component, $V_{out}(DC)$. The product determined by multiplier 31 has a value equal to $KV_s$, a fraction of the electrostatic potential $V_s$. The value of K is known, thus, the electrostatic potential $V_s$ of member 15 can be determined.

Specifically, in the preferred embodiment illustrated in FIG. 1, the electrostatic potential $V_s$ and the AC signal $V_{AC}$ are amplified equally by detector 11. This can be shown by superposition, i.e.:

$$V_o = V_s(\frac{C_1}{C_1 + C_2}) + V_{AC}(\frac{C_1}{C_1 + C_2}); \quad (1)$$

Further, $$V_{out} = AV_o; \quad (2)$$

$$V_{out}(AC) = \frac{AC_1}{C_1 + C_2} V_{AC} = MV_{AC}; \quad (3)$$

$$V_{out}(DC) = \frac{AC_1}{C_1 + C_2} V_s = MV_s; \quad (4)$$

$$V_Q = \frac{KV_{AC}}{V_{out}(AC)} = K/M; \text{ and} \quad (5)$$

$$V_M = V_{out}(DC) \times V_Q = KV_s \quad (6)$$

Since K is known, the electrostatic potential $V_s$ can be determined by measuring the gain of detector 11 in response to the AC signal $V_{AC}$ and by dividing the DC output $V_{out}(DC)$ of detector 11 by this gain.

In operation, the present invention provides for measurement of an electrostatic potential $V_s$ on member 15. This measurement may be made without directly coupling AC voltage source 21 to member 15. Further, this measurement is insensitive to probe size, probe placement and amplifier gain.

Figure 2:
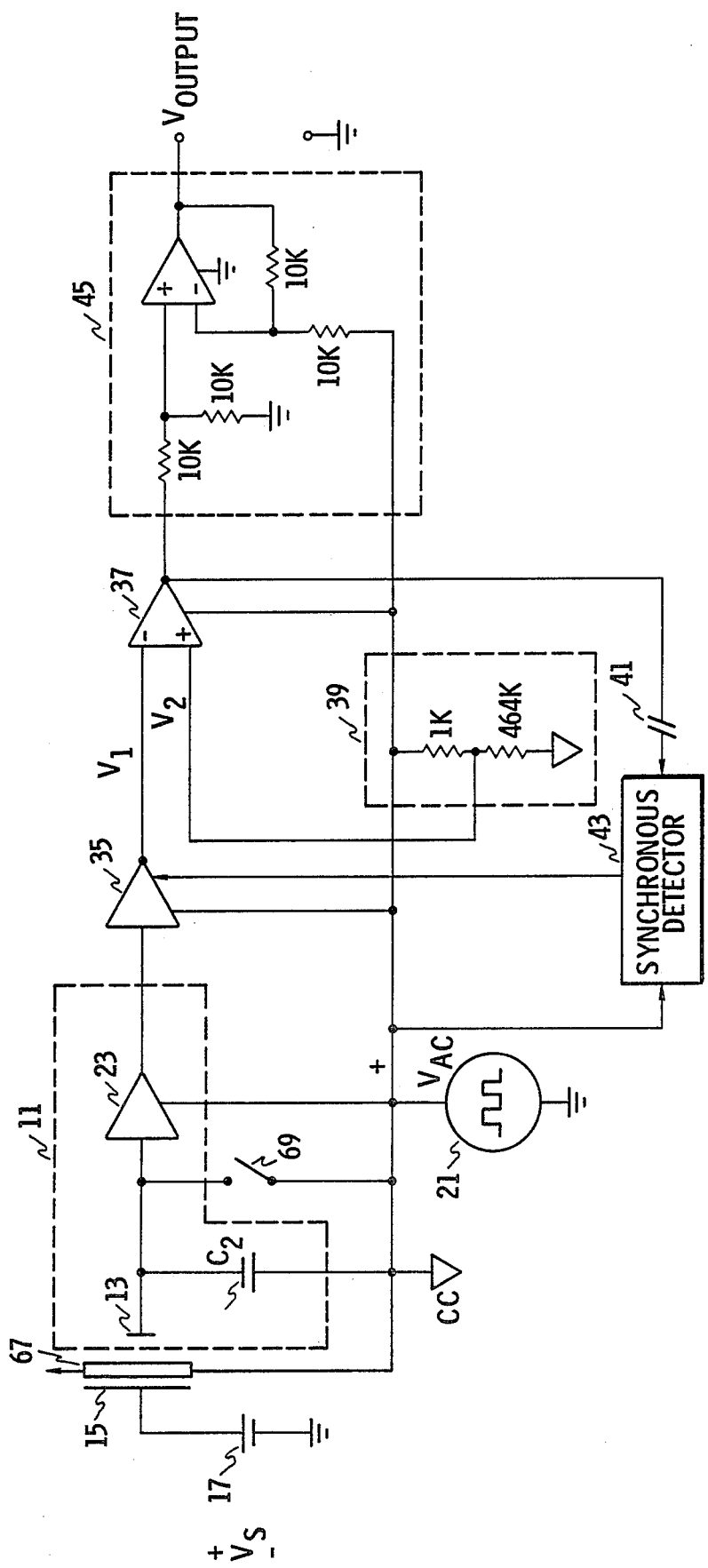
FIG. 2 is a block diagram of an electrostatic voltmeter according to another preferred embodiment of the present invention.

According to the preferred embodiment illustrated in FIG. 2, member 15 is selectively capacitively coupled to detector 11 as above. Similarly, AC voltage source 21 is coupled between circuit common CC and ground for maintaining the circuit common at a voltage $V_{AC}$ relative to ground. Amplifier 23 of detector 11 comprises a high impedance unity gain preamplifier. This amplifier is coupled to an adjustable gain amplifier 35 having a gain adjustable from 1 to 24. Amplifier 35 is coupled to an inverting input of a differential amplifier 37 and provides an output signal $V_1$ thereto having a DC component related to the electrostatic potential and having an AC component related to the AC signal $V_{AC}$. The preferred gain of amplifier 37 is 5. A voltage divider 39 is coupled between circuit common CC and ground to provide an AC signal $V_2$ to a non-inverting input of amplifier 37. AC signal $V_2$ is a known fraction of AC signal $V_{AC}$. Preferably, $V_2 = 0.0014 \, V_{AC}$, where $V_2$ is measured relative to circuit common CC. The output of amplifier 37 is AC-coupled through a capacitor 41 to a synchronous detector 43.

Synchronous detector 43, described in more detail below, is further coupled to circuit common CC and to amplifier 35 for adjusting the gain of amplifier 35 in response to the AC component of the output signal $V_1$ from amplifier 35 such that the AC component of the output signal $V_1$ equals the AC signal $V_2$ provided by divider 39. Thus, the gain of amplifier 35 is adjusted so that the ratio of the AC component of output signal $V_1$ to the AC signal $V_{AC}$ is equal to 0.0014. The DC component of output signal $V_1$ measured relative to circuit common CC is therefore 0.0014 times the electrostatic potential $V_s$.

Amplifier 37 and circuit common CC are coupled to differential amplifier 45. Amplifier 45 provides a DC output signal $V_{output}$ referenced to ground. Thus, since the gain of the illustrated circuit is adjusted to a known value, the output of amplifier 45 is a known fraction of the electrostatic potential $V_s$.

Figure 3:
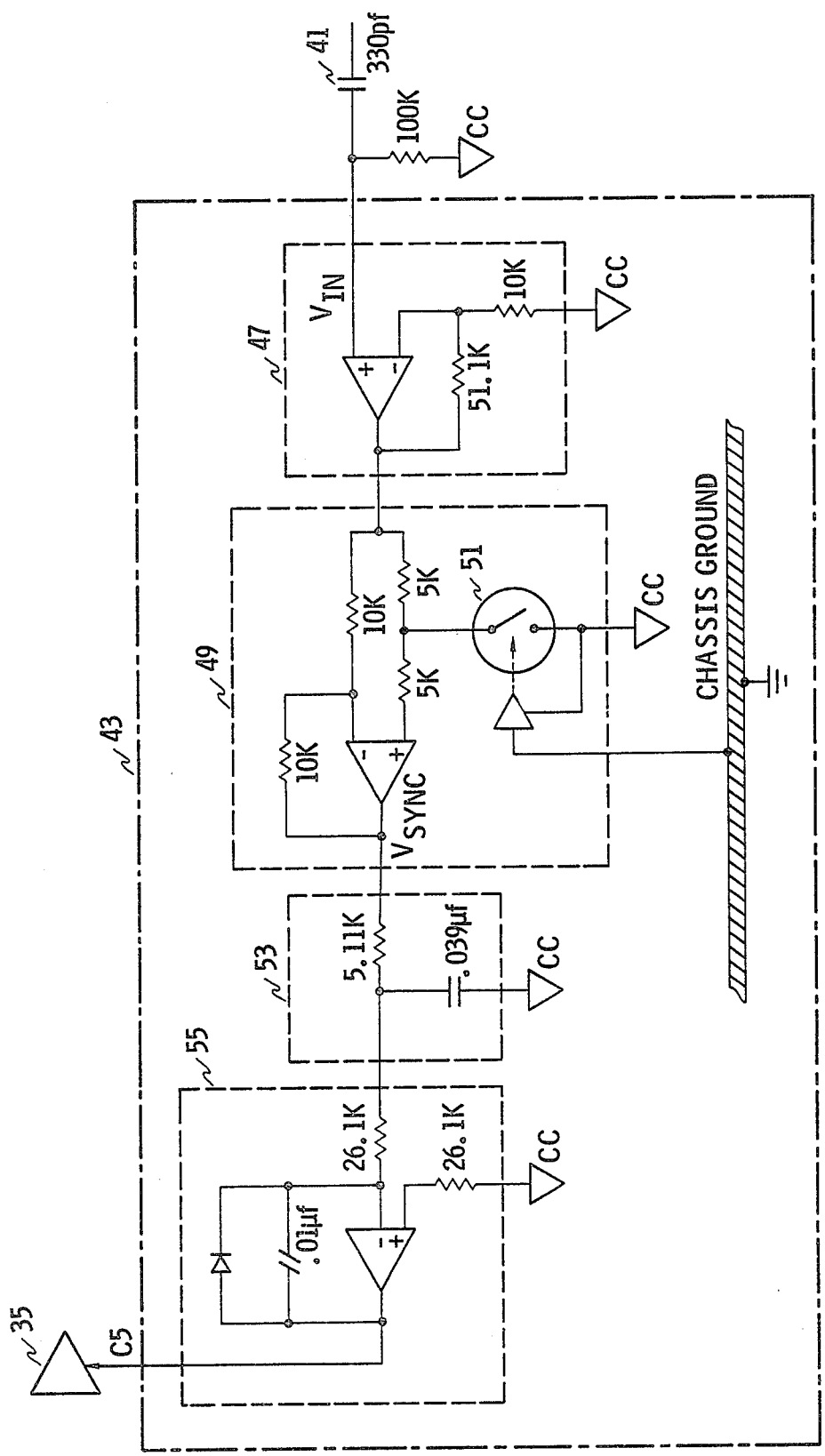
FIG. 3 is a detailed schematic drawing of the synchronous detector shown in FIG. 2.

As illustrated in FIG. 3, capacitor 41 is coupled to the non-inverting input of amplifier 47 of synchronous detector 43. Amplifier 47 amplifies the signal input thereto by a preferred factor of 6.1. Amplifier 47 is coupled to a synchronizer 49. Synchronizer 49 has a selectable gain of either $+1$ or $-1$. The gain is selected in response to the level of the AC signal $V_{AC}$ on the circuit common CC. A switch 51 is closed in response to AC signal $V_{AC}$ being at its high voltage level which causes the gain of synchronizer 49 to become $-1$. Switch 51 is opened in response to $V_{AC}$ being at its low voltage level which causes the gain of synchronizer 49 to become 1. Thus, if the voltage of the output signal $V_1$ from amplifier 35 is greater than the voltage of signal $V_2$ from divider 39, the input signal $V_{IN}$ to synchronous detector 43 is out of phase with the AC signal $V_{AC}$. When signal $V_{IN}$ is out of phase with signal $V_{AC}$, the output signal $V_{SYNC}$ from synchronizer 49 is always positive, indicating that the gain of amplifier 35 is too high. If voltage $V_1$ is less than voltage $V_2$, the output signal $V_{SYNC}$ from synchronizer 49 is negative, indicating that the gain of amplifier 35 is too low. Finally, if voltage $V_1$ equals voltage $V_2$, output signal $V_{SYNC}$ from synchronizer 49 is zero, indicating that the gain of amplifier 35 is correct. When output signal $V_{SYNC}$ of synchronizer 49 stabilizes at a voltage of zero, the AC component of the output signal $V_1$ equals $0.0014 \, V_{AC}$.

The output signal $V_{SYNC}$ from synchronizer 49 is coupled to a low pass filter 53. Filter 53 is coupled to an integrator 55 which integrates the filtered signal input thereto and applies an integrated control signal CS to amplifier 35 for adjusting the gain thereof.

Figure 4:
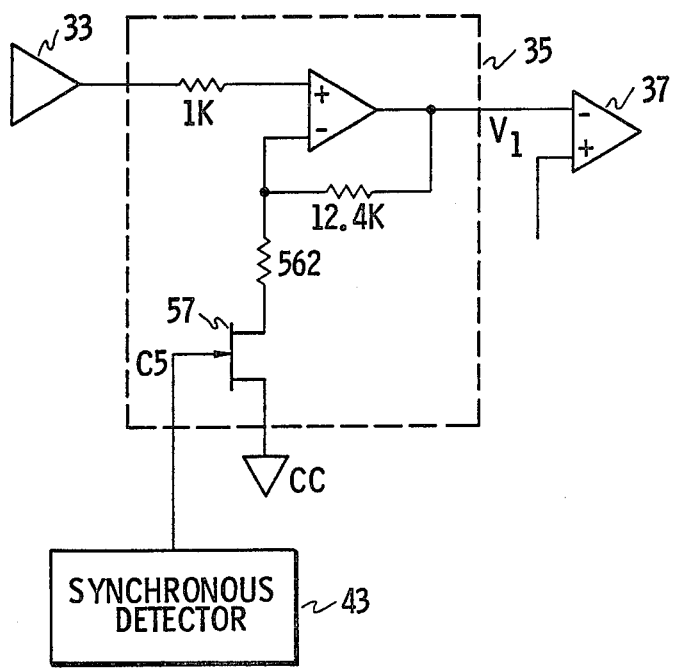
FIG. 4 is a detailed schematic drawing of the adjustable gain amplifier shown in FIG. 2.

As illustrated in FIG. 4, the gate of a field effect transistor (FET) 57 of adjustable gain amplifier 35 is coupled to synchronous detector 43 for receiving the control signal CS. The resistance between the drain and source of FET 57 is responsive to the voltage of control signal CS. The gain of amplifier 35 is responsive to the resistance of FET 57. Thus, the control signal CS from synchronous detector 43 controls the gain of amplifier 35.

In operation, when synchronous detector 43 senses that the AC component of output signal $V_1$ from amplifier 35 is greater than the signal $V_2$ provided by divider 39, the control signal CS becomes more negative. A more negative control signal CS causes the resistance of FET 57 to increase. As the resistance of FET 57 increases, the gain of amplifier 35 is decreased until the AC component of signal $V_1$ equals the value of signal $V_2$. Similarly, the gain of amplifier 35 is adjusted to equalize the AC components of signals $V_1$ and $V_2$ if the AC component of signal $V_1$ is initially less than the value of signal $V_2$.

Once the gain of amplifier 35 is stabilized as above, the overall gain of detector 11 and amplifiers 35, 37 and 45 is equal to a predetermined value. Thus, the electrostatic potential $V_s$ of the surface is simply a known multiple of the value of the DC output signal $V_{output}$ of differential amplifier 45 illustrated in FIG. 2.

Figure 5:
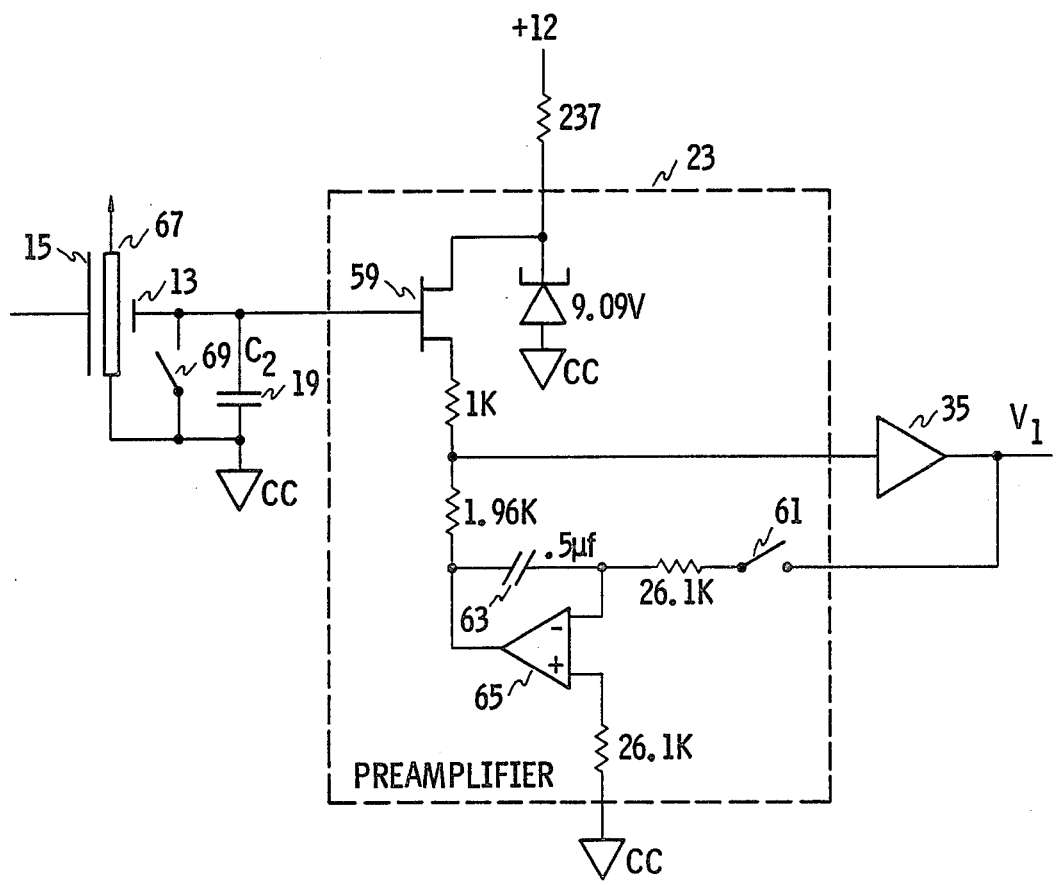
FIG. 5 is a detailed schematic drawing of the preamplifier shown in FIG. 2.

As illustrated in FIG. 5, electrode 13 is coupled to the gate of a FET 59. FET 59 is coupled to amplifier 35 which is selectably coupled by a switch 61 to a negative feedback loop comprising a capacitor 63 and an amplifier 65. The negative feedback loop is coupled to FET 59 for providing a bias current thereto for causing the output voltage of amplifier 35 to equal the voltage of circuit common.

In operation, amplifier 23 is operated in cooperation with a shutter 67, a switch 61, and switch 69 to automatically compensate for offset voltages. Initially, switches 61 and 69 are closed and shutter 67, which is electrically coupled to circuit common CC, is positioned between and capacitively decouples member 15 and electrode 13. In this initial mode of operation, electrode 13 and capacitor 19 are discharged. Switch 69 is thereafter opened. Since switch 61 is still closed, the negative feedback loop maintains the output voltage from amplifier 35 at a value equal to the voltage of circuit common, i.e., $V_{AC}$, by charging capacitor 63 to a steady state compensating voltage. Finally, switch 61 is opened and shutter 67 is repositioned to capacitively coupled member 15 and electrode 13. Capacitor 63 maintains the steady state compensating voltage and thereby corrects the output of amplifier 35 for offset voltages. The output signal $V_1$ from amplifier 35 is thus corrected for any offset errors and is proportional to the electrostatic potential $V_s$ of member 15 as desired.

We claim:

1. Apparatus for producing a signal related to an electrostatic potential of a member comprising:
    alternating current means having first and second terminals, the first terminal AC coupled to the member for providing a predetermined AC voltage between the member and the second terminal;
    a non-contacting electrode supported in spaced relationship to the member and capacitively coupled thereto for providing an electrode signal having AC and DC components;
    capacitance coupling means having a predetermined capacitance for capacitively coupling the second terminal of the alternating current means to the non-contacting electrode; and
    detector means coupled to the non-contacting electrode for providing a detect signal having AC and DC components related to the electrostatic potential of the member.

2. Apparatus as in claim 1 wherein said capacitance coupling means comprises a capacitor capacitively coupled between the non-contacting electrode and the second terminal.

3. Apparatus as in claim 2 further comprising output means coupled to receive the detect signal and coupled to the second terminal for providing a DC output signal representative of the electrostatic potential of the member in response to the DC and AC components of the detect signal and to the signal on the second terminal.

4. Apparatus as in claim 3 wherein the output means further comprises a variable gain amplifier having a first input coupled to receive the detect signal and having a second input coupled to the second terminal for providing an amplified signal in response to the received detect signal referenced to the signal on the second input, the amplification of the variable gain amplifier being variable in response to the AC component of the detect signal for establishing a predefined ratio between the values of the AC component of the amplified signal and the predetermined AC voltage.

5. Apparatus as in claim 4 where the alternating current means is coupled between the capacitor and ground.

6. Apparatus as in claim 5 wherein the output means further comprises a first differential amplifier having a first input terminal coupled to receive the amplified signal, a second input terminal coupled to the second terminal and having an output for providing a difference signal on the output referenced to the second terminal, the output AC coupled to the variable gain amplifier, wherein the amplification of the variable gain amplifier is responsive to the AC component of the difference signal.

7. Apparatus as in claim 6 wherein the output means further comprises synchronizer means having a first input terminal coupled to the second terminal, a second input terminal AC coupled to receive the difference signal, and an output coupled to the variable gain amplifier for providing a DC signal in response to the value of the AC component of the detect signal.

8. Apparatus as in claim 6 further comprising a second differential amplifier having one terminal coupled to receive the difference signal and another terminal coupled to the second terminal for providing a direct current output signal proportional to the electrostatic potential of the member.

9. Apparatus as in claim 8 comprising a voltage divider coupled between the second terminal and ground and having an output coupled to the second input terminal of the first differential amplifier for providing a signal having a predefined ratio to the predetermined AC voltage.

10. A method for measuring an electrostatic potential on a member using a non-contacting electrode having a capacitance element coupled thereto, comprising the steps of:
    applying an AC voltage in series circuit between the member and the capacitance element;
    capacitively coupling the electrode to the member for providing an electrode signal having a DC component related to the electrostatic potential and having an AC component responsive to the AC voltage;
    determining a gain factor in response to the AC component of the electrode signal; and
    determining the electrostatic potential on the member in response to the gain factor and the DC component of the electrode signal.

11. A method for measuring an electrostatic potential of a member using a non-contacting electrode having a capacitance element coupled thereto, the method comprising the steps of:
    applying an AC voltage in series circuit between the member and the capacitance element; and
    determining the electrostatic potential on the member in response to the AC and DC components of the signal on the non-contacting electrode.

12. A method as in claim 11 further comprising the steps of:

amplifying the signal on the non-contacting electrode by a variable gain; and adjusting the variable gain in response to the AC component of the signal on the electrode to establish a predetermined relationship between the electrostatic potential and the DC component of the signal on the electrode.

13. Apparatus for producing a signal related to an electrostatic potential of a member comprising:

a non-contacting electrode capacitively coupled to the member for providing an electrode signal responsive to the electrostatic potential and AC voltage of the member;

coupling means having a predetermined capacitance coupled to said non-contacting electrode;

alternating current means coupled in series between the member and said coupling means for providing the AC voltage on the member; and means for determining the electrostatic potential on the member in response to the AC and DC components of the electrode signal.

* * * * *